United States Patent
Boerman et al.

(10) Patent No.: US 7,493,093 B2
(45) Date of Patent: Feb. 17, 2009

(54) SWITCHABLE POWER LEVEL DETECTOR FOR MULTI-MODE COMMUNICATION DEVICE

(75) Inventors: Steven P. Boerman, North Easton, MA (US); Paul T. DiCarlo, Wakefield, MA (US); Patrice Reginella, Lexington, MA (US)

(73) Assignee: Skyworks Solutions, Inc., Woburn, MA (US)

( * ) Notice: Subject to any disclaimer, the term of this patent is extended or adjusted under 35 U.S.C. 154(b) by 361 days.

(21) Appl. No.: 11/159,926

(22) Filed: Jun. 23, 2005

(65) Prior Publication Data
US 2006/0246858 A1    Nov. 2, 2006

Related U.S. Application Data

(60) Provisional application No. 60/675,813, filed on Apr. 27, 2005.

(51) Int. Cl.
H01Q 11/12 (2006.01)
H04B 1/04 (2006.01)
(52) U.S. Cl. .................. 455/126; 455/127.2; 455/127.4
(58) Field of Classification Search ................ 455/126, 455/127.1, 127.2, 127.4, 127.5, 550.1, 552.1, 455/103; 375/295
See application file for complete search history.

(56) References Cited

U.S. PATENT DOCUMENTS

| | | | |
|---|---|---|---|
| 4,162,452 A | 7/1979 | Ash | |
| 4,758,802 A | 7/1988 | Jackson | |
| 5,055,800 A | 10/1991 | Black et al. | |
| 5,111,162 A | 5/1992 | Hietala et al. | |
| 5,179,353 A * | 1/1993 | Miyake ...................... 330/129 |
| 5,553,319 A | 9/1996 | Tanabakuchi | |
| 5,661,434 A | 8/1997 | Brozovich et al. | |
| 5,895,436 A | 4/1999 | Savoie et al. | |
| 6,108,527 A * | 8/2000 | Urban et al. ............. 455/115.3 |
| 6,233,440 B1 | 5/2001 | Taylor | |
| 6,300,837 B1 | 10/2001 | Sowlati et al. | |
| 6,445,247 B1 | 9/2002 | Walker | |
| 6,466,768 B1 | 10/2002 | Agahi-Kesheh et al. | |
| 6,492,875 B2 | 12/2002 | Luo et al. | |
| 6,496,061 B1 | 12/2002 | Bloom et al. | |

(Continued)

FOREIGN PATENT DOCUMENTS

EP    0800267    8/1997

(Continued)

*Primary Examiner*—Nguyen Vo
(74) *Attorney, Agent, or Firm*—Weide & Miller, Ltd.

(57) ABSTRACT

A method and apparatus for power detection in a multi-mode communication device configured for operation in different modes or frequency bands. A detector monitors the power level of an amplified outgoing signal. The detector may be configured with a switch and two or more samplers. Responsive to the mode of operation, the detector adopts an optimal configuration to generate a power level feedback signal, which is provided to a digital signal processor or controller. Comparison of the power level feedback signal to a target value may occur to generate an amplifier control signal. The amplifier control signal controls the gain, applied by an amplifier, to the outgoing signal. During operation, the system monitors for a change in the mode of operation and upon responsive to a change, generates a switch control signal to reconfigure the detector configuration to match the new mode of operation.

29 Claims, 6 Drawing Sheets

U.S. PATENT DOCUMENTS

| | | |
|---|---|---|
| 6,763,228 B2 | 7/2004 | Prentice |
| 6,806,838 B2 | 10/2004 | Petros et al. |
| 6,819,182 B2 | 11/2004 | Sibrai |
| 2002/0072326 A1 | 6/2002 | Qureshey et al. |
| 2004/0032373 A1 | 2/2004 | Petros et al. |
| 2004/0142674 A1 | 7/2004 | Kuiri |
| 2005/0245213 A1* | 11/2005 | Hirano et al. ............ 455/127.1 |

FOREIGN PATENT DOCUMENTS

| | | |
|---|---|---|
| GB | 2235855 | 3/1991 |

* cited by examiner

SWITCHABLE POWER LEVEL DETECTOR FOR MULTI-MODE COMMUNICATION DEVICE

PRIOR APPLICATION DATA

This application claims priority to U.S. Provisional Application Ser. No. 60/675,813 filed Apr. 27, 2005.

FIELD OF THE INVENTION

The invention relates to wireless communication and, in particular, to a method and apparatus for switching a signal detector.

RELATED ART

Mobile communication devices have become popular in the United States, and throughout the world. For various reasons, numerous different communication standards have been adopted and implemented in not only the United States, but also, in different countries. Certain communication standards, and in particular, those more recently adopted, provide for advanced features, such as increase call volume, power control, voice mail, high rate data communication, and text messaging. While these features are in popular demand, existing wireless communication infrastructure remains in use, particularly in less densely populated locations. In addition, as users of mobile communication devices travel they may encounter different communication standards.

As a result, multi-mode communication devices have been proposed which are capable of operation under two or more different communication standards. One example type of multi-mode mobile communication device is a tri-mode cellular telephone capable of operating in accordance with three different communication standards. For example, even when driving a user may exit a cell boundary, which is operating under a first communication standard, such as GSM, and then enter a cell operating under a different communication standard, such as CDMA. While it would be possible to end and re-start the call when entering into a new cell, which is operating under a different communication standard, terminating and renewing the call is cumbersome and disruptive.

Thus, there is a desire in the art to maintain real time communication as the communication device travels between locations which are operating under different communication standards. Various solutions have been proposed to achieve undisrupted communication while the communication device is operating and traveling between areas operating under different communication standards.

Numerous modern communication standards require transmit power control to reduce power consumption and reduce crosstalk. Thus, when switching operation to operation under a different communication standard, it may be necessary to change the transmit power level. Likewise, when the distance between the mobile communication device and base station changes, changes in the power level may also occur. However, different various communication standards often transmit signals within different frequency bands and thus, monitoring the power level or other aspect of an outgoing signal which jumps between different frequency bands is challenging.

Prior art solutions for dynamically monitoring transmit power levels, particularly in a multi-mode communication device have numerous drawbacks. One such solution consists of a multi-band coupler capable of detecting the power level of the received signal. However, multi-band couplers provide inadequate isolation, may introduce unwanted harmonics, and may provide inaccurate results. Such inaccurate results may hinder device operation, increase power consumption, and create disruptive crosstalk. In addition, such prior art solutions utilized two or more detectors, which due to inherent limitations in manufacturing techniques, were mismatched. As a result, complex and costly compensation, such as temperature or biasing compensation, was necessary to achieve desired operation.

Consequently, there is a need in the art for an accurate power detector in a multi-band communication device capable of dynamic operation during transition between bands or modes of operation of the mobile communication device. As described below, the method and apparatus as described and claimed herein provides such a solution and additional benefits.

SUMMARY

To overcome the drawbacks associated with the prior art and provide additional advantages as described herein, a method and apparatus is disclosed that selectively controls a detector configuration to match a mode of operation. By selectively configuring the detector to match a mode of operation, such as a frequency band associated with a mode of operation, transmit power control may occur during multi-mode operation.

In one embodiment, a method is disclosed for detecting the transmit power level in a multi-mode communication device. This example method comprises sending a switch control signal to a switch in response to a mode selected from two or more possible modes of operation and then, responsive to the switch control signal, connecting a sampler to a detector. The sampler corresponds to the selected mode. The method then amplifies the outgoing signal to generate an amplified outgoing signal and detects the amplified outgoing signal to determine the power of the amplified outgoing signal. The method also generates a power level feedback signal and processes the power level feedback signal to generate an amplifier control signal. The amplifier control signal is sent to the amplifier to control a power level of the outgoing signal.

In one configuration, the power level feedback signal comprises a voltage level representing the power level of the amplified outgoing signal. It is also contemplated that processing the power feedback signal may comprise comparing the power level feedback signal to a target value. In one embodiment the step of connecting a sampler may comprise configuring a switch to connect a sampler selected from two or more samplers to a detector. The method may further comprise monitoring the mode of operation, and upon detecting a change in mode of operation, generating a switch control signal. With regard to the mode of operation, each mode of operation may be associated with a frequency band.

Also disclosed herein is a method for adjusting power level when switching between bands in a multiband wireless communication device. In one embodiment, this method comprises monitoring for a change in mode of operation from a first mode to a second mode and, responsive to detecting in a change in mode of operation, generating and sending a switch control signal to a switch. Then, responsive to the switch control signal, selectively changing a detector configuration from operation in a first detector mode to operation in a second detector mode. The method then detects one or more aspects of an outgoing signal and, responsive to this detecting one or more aspects of an outgoing signal, generates an amplifier control signal to thereby control the power level of the outgoing signal.

In one embodiment, the step of generating and sending the amplifier control signal further comprises providing the amplifier control signal to an amplifier to control amplifier gain. A change in mode may comprise operation within a different frequency band. It is contemplated that selectively changing a detector configuration comprises switching a sampler configured for operation in the second mode to be connected to the detector. It is further contemplated that detecting one or more aspects of the outgoing signal comprises detecting a power level of an amplified outgoing signal. In one embodiment, the method responsive to detecting one or more aspects of an outgoing signal, comprises comparing the power level of the outgoing signal, or a signal representing the power of the outgoing signal, to a target value.

In addition to these methods, a system is also disclosed for detecting transmit power level in a multi-mode wireless communication device. In one embodiment, this system may comprise an amplifier configured to receive an outgoing signal and generate an amplified outgoing signal responsive to an amplifier control signal. The system may also include or comprise a detector that is configured to sample the amplified outgoing signal and generate a feedback signal regarding the power level of the amplified outgoing signal. The detector may be further configured with a switchable selector to configure operation of the detector to match a mode of operation. A controller may also be provided and configured to process the feedback signal to generate the amplifier control signal.

In one embodiment the switch may comprise a triband switch having three inputs and a single output. The detector may comprise a diode. The controller may comprise a digital signal processor. In one embodiment the switchable selector comprises a switch configured to receive a switch control signal from the controller to selectively utilize a sampler matched to an active mode of operation of the multi-mode wireless communication device. This system may be utilized in a multi-mode wireless communication device comprises a tri band cellular telephone. It is further contemplated that the controller may be configured to compare the feedback signal to a target value and responsive to the comparison, generate the amplifier control signal.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION

Figure 1:
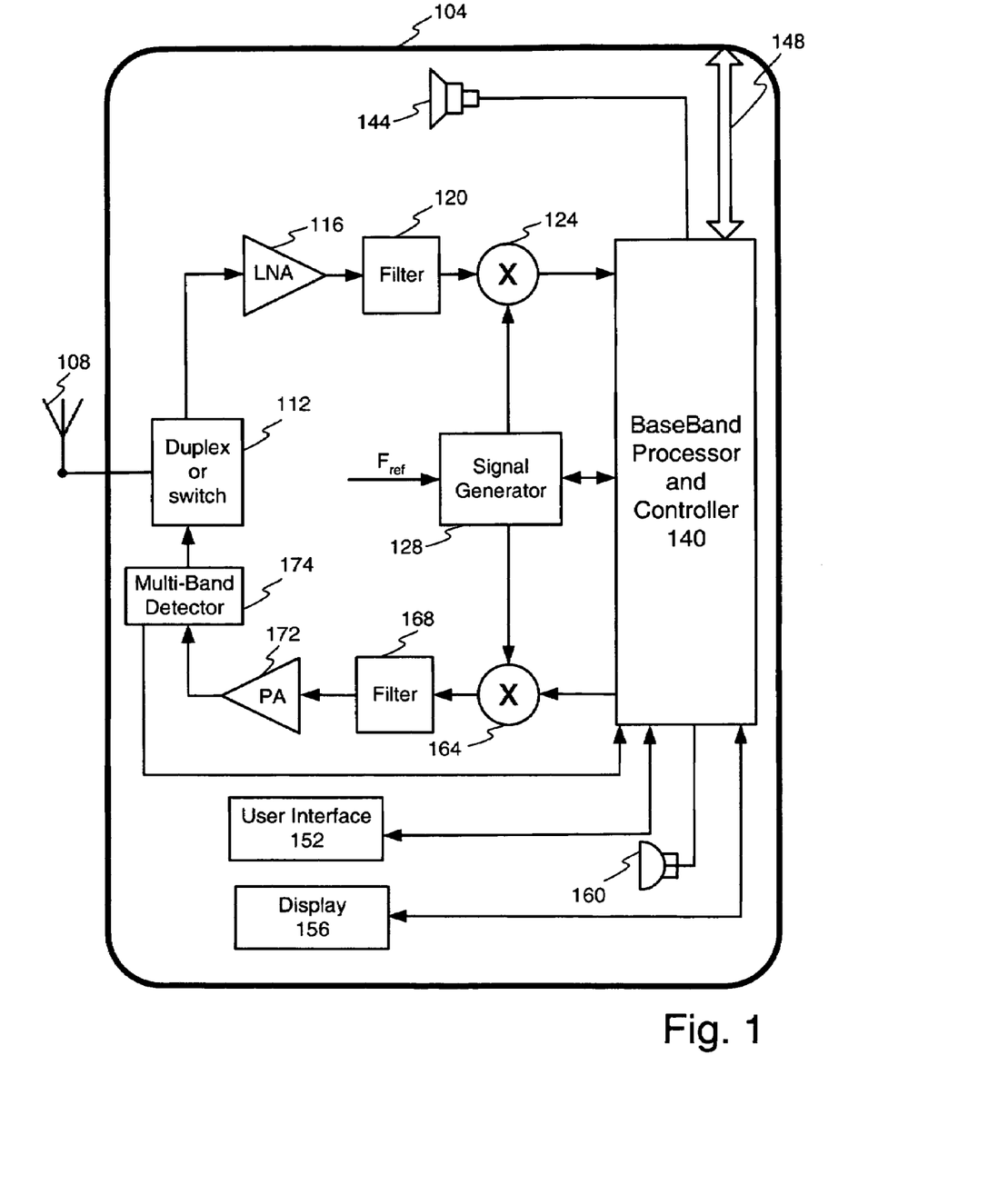
FIG. 1 illustrates a block diagram of example environment of use in a wireless communication device.

FIG. 1 illustrates a block diagram of a first example environment of use of the invention. The example environment shown in FIG. 1 comprises a wireless communication device but it is noted that this is but one of many possible example environments of use. It is contemplated that the invention may find use and provide benefit in numerous other environments both in the communication field and other fields of use.

The wireless communication device shown in FIG. 1 comprises an outer housing 104 configured to protect and selectively enclose the internal electronic apparatus. An antenna 108 receives incoming signals and transmits outgoing signals. The antenna 108 may be located inside or outside of the housing 104. A duplexer 112 connects to the antenna 108 to route incoming signals to a receiver apparatus, shown as the upper path from the duplexer 112 and route outgoing signals to the antenna.

The duplexer 112 connects to a receiver apparatus to thereby route received signals to a low noise amplifier (LNA) 116 that is configured to increase the signal power level for a particular frequency band to a level appropriate for processing by subsequent apparatus. The LNA 116 output connects to a filter 120 which may be configured to perform additional filtering or processing, such as for example band pass filtering or processing to mitigate the effects of the wireless channel.

After filtering, a mixer 124, also known as a down-converter, processes the received signal in conjunction with a signal from a signal generator 128. The mixer may be configured to extract a baseband signal by multiplying the received signal at a carrier frequency with a signal from the signal generator that is also at the carrier frequency. As is well understood, the mixer 124 outputs the desired carrier signal.

The output from the mixer 124 feeds into a baseband processor and controller 140 configured to receive and process the incoming baseband signal. In one embodiment, the baseband processor and controller 140 converts the incoming signal to a digital format, processes the digital signal, and then creates an analog signal which is provided to a speaker 144. Alternatively the digital signal may be provided directly to a data port 148. In this embodiment, the baseband processor and controller 140 is in communication with the signal generator 128 to synchronize operation.

The baseband processor and controller 140 is also configured to communicate data to and from a user interface 152, such as with one or more keys or buttons, and a display 156 configured to display text, graphics, or other information to a user.

To perform transmission of outgoing signals, the baseband processor and controller 140 may receive a signal from a microphone 160 or digital data from the data port 148. Upon receipt of an outgoing signal, the baseband processor and controller 140 processes the outgoing information to a baseband signal and outputs this baseband signal to a mixer 164, which may also be referred to as an up-converter. The mixer 164 multiplies the baseband signal with an input from the signal generator 128 at the desired carrier frequency. The resulting outgoing signal comprises the baseband signal modulated to the carrier frequency and is ready for filtering and processing by the filter 168 and then amplification by a power amplifier 172 to a power level suitable for transmission by the antenna 108 after passing through the duplexer 112.

In this embodiment a multiband detector 174 receives the output from amplifier 172. The multiband detector 174 may monitor one or more aspects of the outgoing signal, such as amplitude or power level. In one embodiment, the detector 172 may provide a feedback or data signal to the controller 140 as shown. As discussed below in more detail, the detector 174 may monitor the amplitude of the outgoing signal, i.e. the signal being transmitted, and provide information regarding the amplitude to the controller 140.

Figure 2:
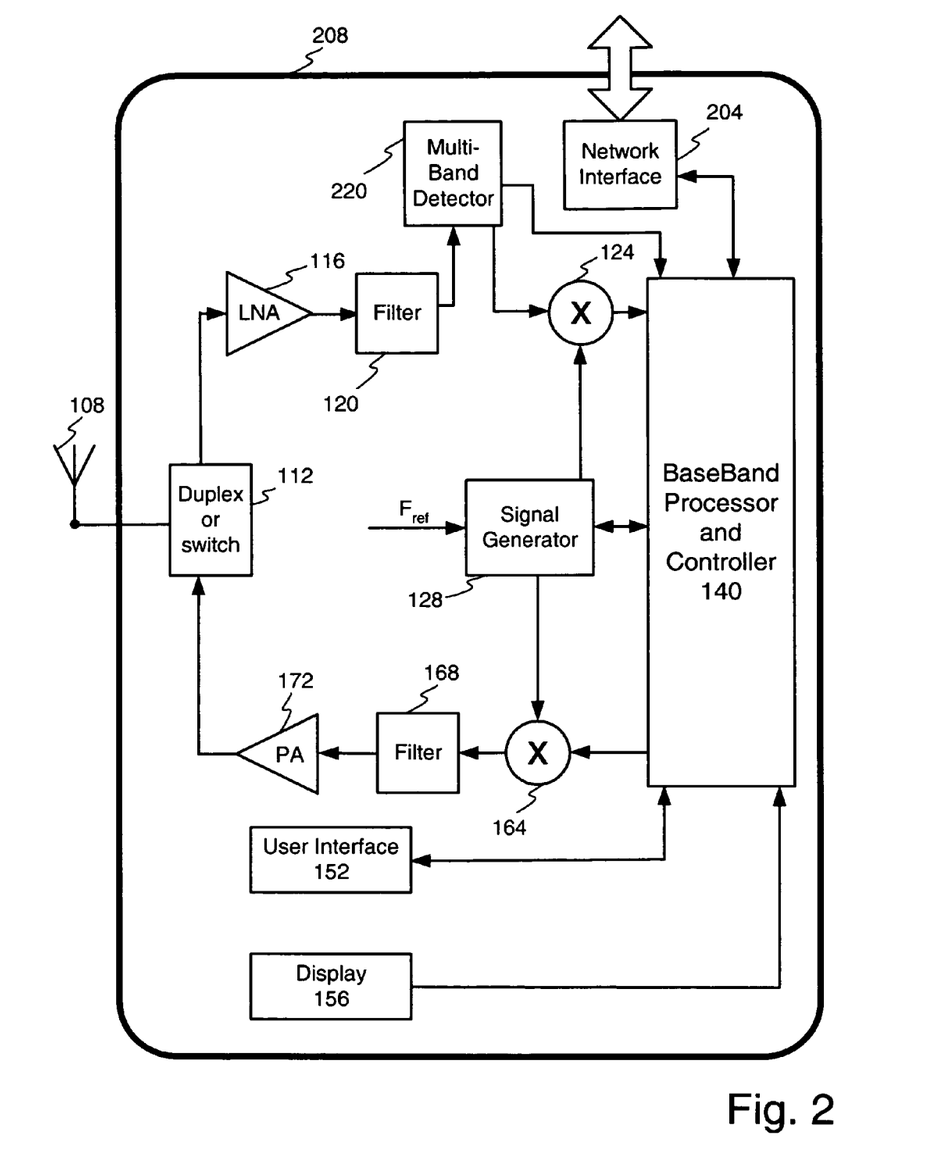
FIG. 2 illustrates a block diagram of example environment of use in a base station.

FIG. 2 illustrates a block diagram of a second example environment of use of the invention. FIG. 2 shares numerous similarities with FIG. 1 and thus, wherein the aspects that differ from FIG. 1 are discussed in detail. The embodiment of FIG. 2 is directed to a base station 208 or non-mobile communication device configured to communicate with one or more other communication devices. In this configuration, which may represent a base station communication system 208, the baseband processor and controller 140 communicate with a network interface 204. The network interface 204 may be configured to receive one or more signals or packet-based-data from the processor and controller 140. The one or more signals or packet-based-data is output to a computer network, internet PSTN, or other medium that interfaces with a telephone network, data network, or cellular communication system. When configured as a base station 208, the system shown in FIG. 2 facilitates completion of a mobile telephone call, such as a telephone call from a cell phone or to a land line. These calls are often completed via the network interface 204 of the base station 208.

Also shown in FIG. 2 is a multiband detector 220, which in this embodiment is configured to receive the output of the filter 120. The detector 220 passes the incoming signal to the mixer 124, while also providing information or data regarding one or more aspects of the incoming signal to the controller 140.

Figure 3:
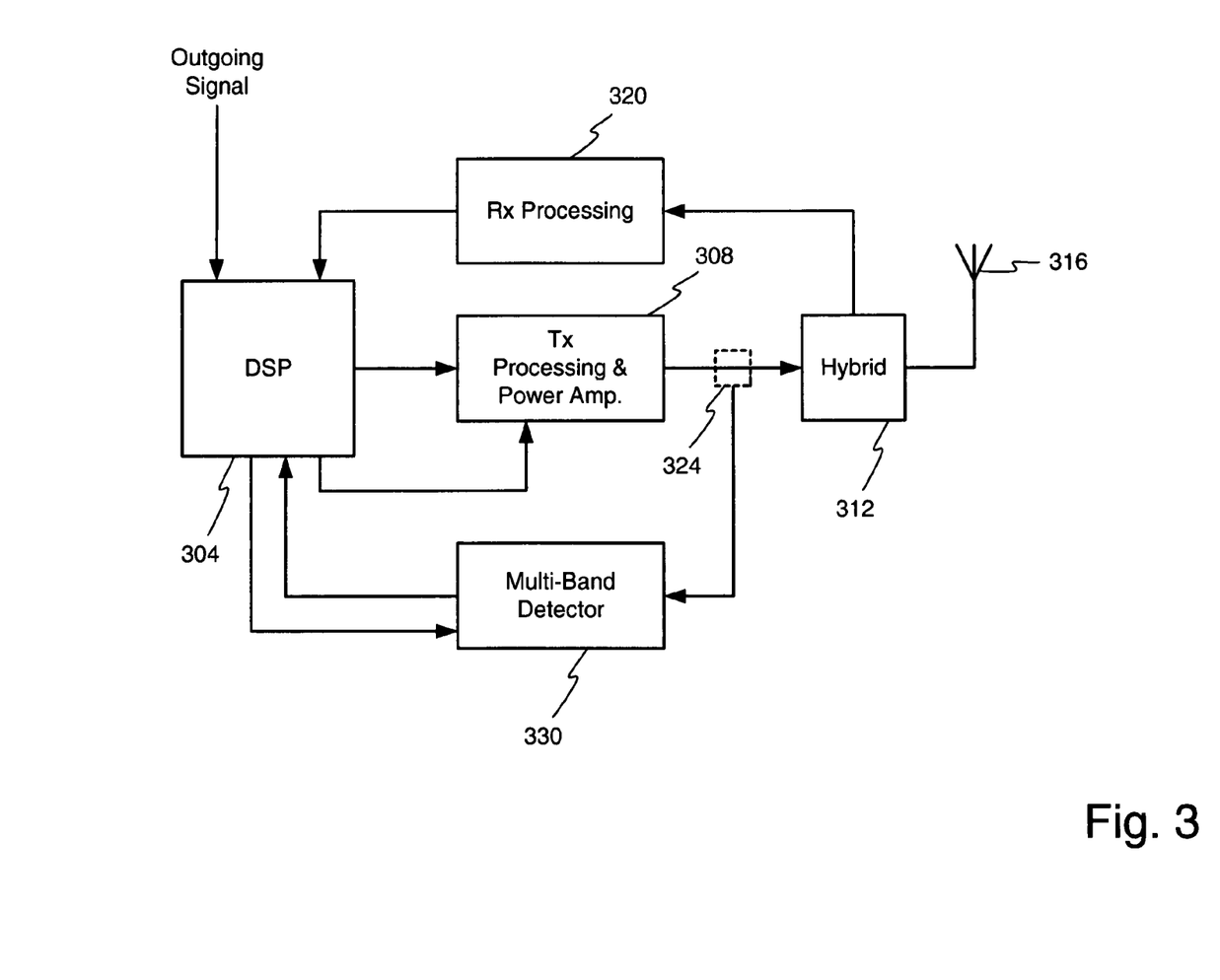
FIG. 3 illustrates an example embodiment of a multi-band detector in connection with a mobile communication device.

FIG. 3 illustrates an example embodiment of a multi-band detector in connection with a mobile communication device. In this example embodiment, an outgoing signal is provided to a digital signal processor (DSP) 304. The DSP may comprise any device capable of processing an outgoing signal, which may comprise voice or data, as may be desired for wireless communication. Operation of the baseband processor, such as the DSP 304, is generally understood in the art and hence is not described herein beyond that necessary to understand operation of the invention. Although shown as a DSP, element 304 may comprise any device capable of or configured to perform as described herein. Element 304 may comprise, but is not limited to, a digital signal processor, ASIC, logic, controller, processor, microprocessor, ARM, or any modulation control element.

In one embodiment the DSP 304 processes the outgoing signal to a format suitable for transmission over a wireless channel. To achieve transmission, the DSP 304 also connects to a power amplifier 308, which may also be configured to perform additional transmit processing on the outgoing signal prior to transmission.

It is contemplated that the DSP 304 may also provide a power control signal to the amplifier 308 to thereby control the power level, at which the amplifier transmits the outgoing signal. Certain communication standards utilize transmit power level control to improve spectrum efficiency, reduce noise and crosstalk, and reduce battery consumption. The power level control signal generated by the DSP 304 may control the gain of the amplifier 308 to achieve the desired transmit power level.

The output of the amplifier 308 connects to a hybrid 312 configured to selectively direct the amplified outgoing signal to an antenna 316 while also directing incoming signals received via the antenna 316 to receiver processing components 320. A detector tap 324 may be located between the amplifier 308 and the antenna 312, to monitor one or more aspects of the outgoing signal. In this embodiment tap 324 connects to a multiband detector 330. In other embodiments the detector 330 may be placed after the amplifier and the tap 324 may not be utilized. The term mode and band are generally understood to have a similar meaning, namely defining a particular manner of operation of the device. One possible difference between different modes or bands of operation may comprise operation within a different frequency band.

Although any aspect of the signal may be monitored, in one embodiment the amplitude of the amplifier output is monitored to detect the transmit power level. Based on this detected transmit power level, the detector 330 provides a feedback or power level signal to the DSP 304. In one embodiment the detector 330 comprises a diode capable of converting the amplitude to a voltage indicative of the transmit power level. It is further contemplated that the detector 330 may comprise one or more switch elements configured to switch between different samplers. The samplers may be configured to detect different frequency bands, such as may be output from the amplifier 308 and transmitted by the antenna 316. The samplers may also be configured as part of the tap 324.

In one embodiment the detector 330 provides a voltage signal to the DSP 304 indicative of the detected transmit power level. In other embodiments the detector 330 may utilized other than a voltage signal to represent the power level. The DSP 304 utilizes the power level feedback signal to thereby generate the amplifier control signal, which is provided from the DSP 304 to the amplifier 308 as shown. In this manner the power level of the amplifier 308 may be controlled to maintain a desired transmit power level based on monitoring of the actual amplified outgoing signal. Moreover, monitoring occurs dynamically regardless of mode or band of operation.

In a multi-mode communication device, operation, such as transmission of an outgoing signal, may occur at different frequencies, dependant on the communication standard or other factors. In such an event, the DSP 304 or other device may provide a control signal to the detector to control which of the multiple possible frequency bands to monitor. In one embodiment a switch may be utilized to selectively switch between two or more sampling devices, which may configured for operation within a particular frequency band or under a particular communication standard.

Figure 4:
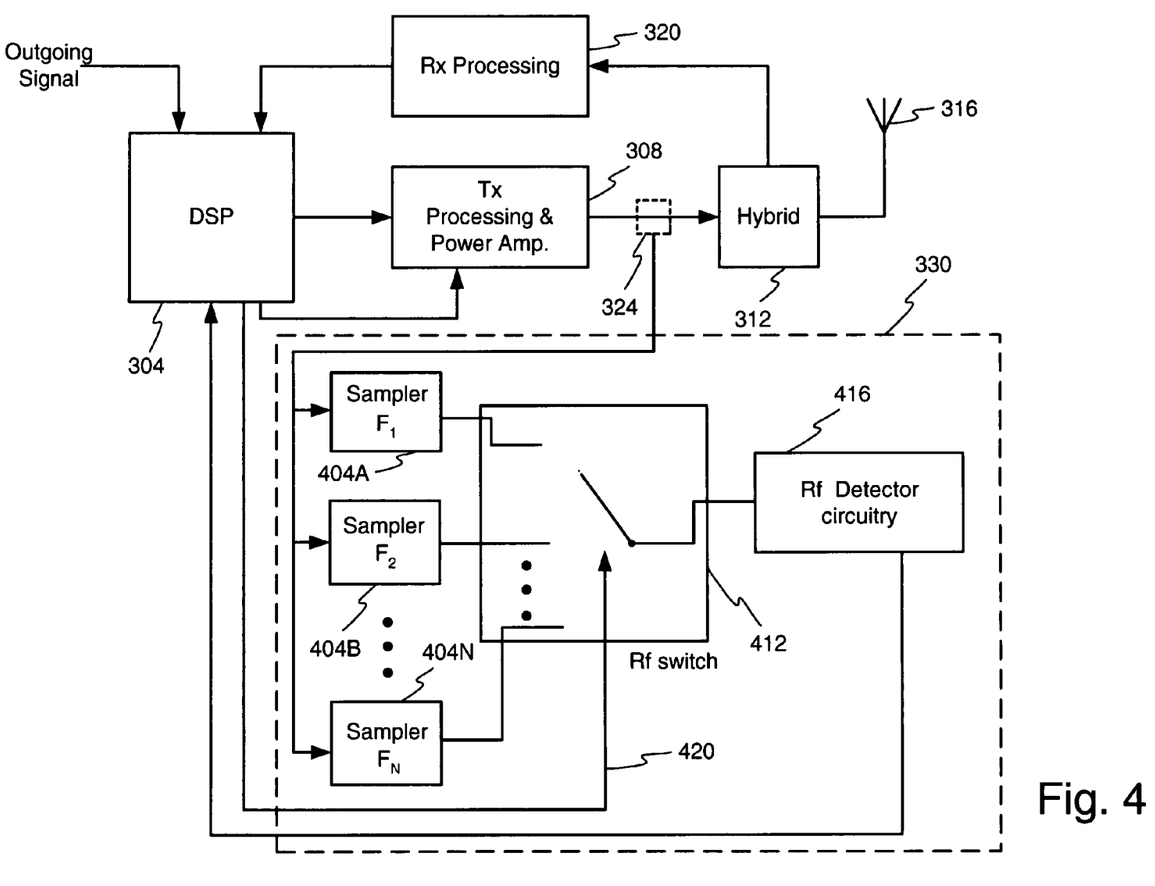
FIG. 4 illustrates a block diagram of an example embodiment of a multi-band detector in connection with a wireless communication device.

FIG. 4 illustrates a block diagram of an example embodiment of a multi-band detector in connection with a wireless communication device. Elements in FIG. 4, which are also shown in FIG. 3, are identified with common referenced numbers. The configuration of the multi-band detector 330 is now described in detail. Receiving the output of the tap 324 are one or more samplers 404A, 404B through 404N, where N is any whole number. In this embodiment the samplers 404 are configured or tuned to a particular frequency, although in other embodiments the samplers may be configured to monitor one or more other aspects of the outgoing signal. By tuning the samplers 404 to different frequencies, the detector 330 is capable of monitoring signals of different frequencies, such as outgoings signal transmitted during operation in different modes or communication standards.

The samplers 404 may comprise any device or element configured to monitor the amplified outgoing signal. In one embodiment the samplers 404 comprise couplers. In other embodiments the samplers 404 may comprise, but are not limited to the following devices, resistors, capacitors, filters, resonators, hybrid circuits, which may be configured in software, hardware or both. In one embodiment the DSP 304 or controller is configured to perform the detection. In one embodiment the output of a sampler 404 comprises the amplitude of the outgoing signal. In one embodiment the output of the sampler 404 comprises an average power level.

The output of the samplers 404 feed into a switch circuit 412 configured to selectively connect the output from the samplers 404 to a detector circuit 416. The detector circuit 416 connects to the output port of the switch circuit 412 as shown. The switch 412 receives a control signal from the DSP 304 via path 420. The switch control signal serves as a selector signal thereby controlling which sampler 404 is connected to the detector circuitry 416 via the switch output. In one embodiment the switch control signal from the DSP 304 is generated when the communication device changes mode, such as would often initiate operation of the communication device in a different frequency band.

In this manner, the switch 412 may be controlled to selectively connect one or more of the samplers 404 to the detector circuitry 416. It is contemplated that the switch 412 may be matched to the samplers 404 such that the switch may have up to N input ports, i.e. any number of input ports. Any type switch may be utilized that provides a low noise, lower power loss, and high isolation solution. In one embodiment the switch 412 comprises a multi-band switch.

The detector circuitry 416 receives the sampler 404 output for processing. In one embodiment the detector circuitry 416 converts the amplitude signal from the sampler 404 to a voltage value representative of the amplitude or power level of the outgoing amplified signal. In other embodiments, the detector circuitry 416 may generate any type signal that represents the power level of the outgoing signal. The power level may comprise the peak level, the average power, envelope detection, logarithmic, negative peak, RMS, or any other indicator of transmit power or any power level in general. The detector 416 may comprise a diode, log amplifier, discrete transistor, FET, or integrated circuit or any other device capable of processing the signal from the sampler 404.

The power level feedback signal from the detector 416 is provided to the DSP 304, which processes the power level feedback signal and generates a power control signal. The power control signal is provided from the DSP 304 to the amplifier 308 to thereby control the gain or other factor of the amplifier operation. This in turn may control the power level of the amplified outgoing signal. Consequently, based on the monitoring the power level of the amplified outgoing signal, the actual transmit power level may be adjusted to comply with the communication standard.

In one embodiment the DSP 304 performs a comparison between the actual power level, as provided via the power level feedback signal, and a target power level value. In one embodiment, the DSP 304 generates the target value based on one or more aspects of operation. In one embodiment, the target value is sent from the base station, based on the power level of the actual received signal. By way of example and not limitation, it may be desirable for the base station to receive a signal at a constant power level, regardless of the distance, or other factors, between the base station and the communication device. Thus, the base station detects the power level of the received signal and based on this power level, may transmit a control code to the wireless communication device to maintain, increase, or decrease the transmit power level, which in turn maintains a constant received signal power level. This control code, from the base station, may be utilized as a target value by the DSP 304.

Figure 5A:
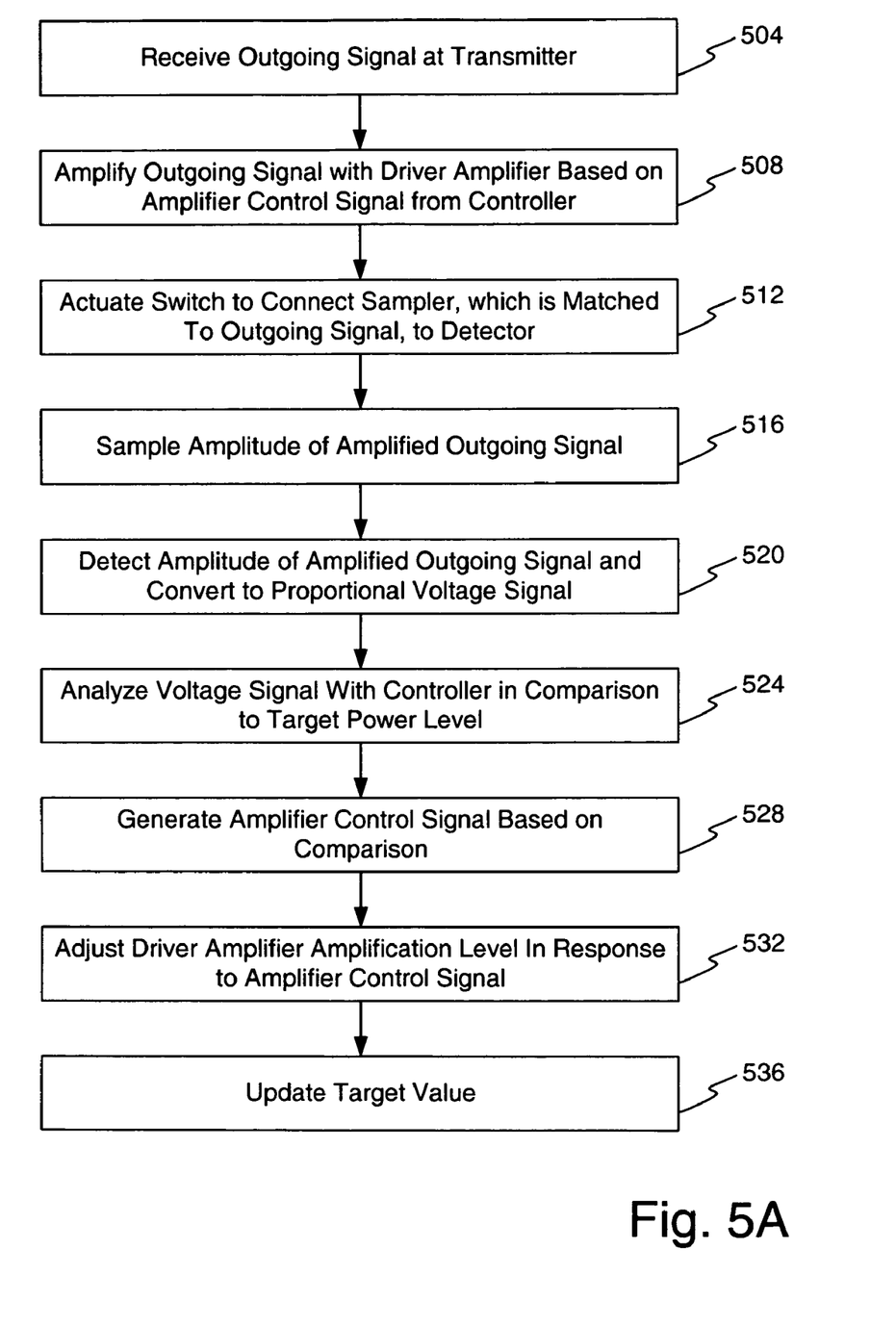
FIGS. 5A and 5B illustrate an operational flow diagram of an example method of operation.

FIG. 5A illustrates an operational flow diagram of an example method of operation. This is but one possible exemplary method of operation and as such, the claims that follow are not limited to this particular method of operation. At a step 504, as shown in FIG. 5A, the DSP or controller receives the outgoing signal at the transmitter. The outgoing signal may comprise any type signal, such as but not limited to data or a voice signal. At step 508, a driver amplifier or other gain device amplifies the outgoing signal based on an amplifier control signal, which may also be referred to as a power control signal. The amplifier control signal may be provided to the driver amplifier from the DSP or controller, or in one embodiment, directly from the detector.

At a step 512, the operation actuates the switch to selectively connect the sampler, which is matched to the frequency band of the outgoing signal, to the detector. A switch control signal may be provided from the DSP or controller to the switch to select the proper switch position. In one embodiment the switch position is based on the communication standard under which wireless device operation is occurring to thereby match the sampler that is in use to the desired frequency or the frequency band that is in use.

After the outgoing signal is amplified and at a step 516, the amplified signal is sampled, and the sample output is provided through the switch to the detector. At a step 520, the detector detects the power level of the outgoing signal, and in one embodiment, converts the power level to a representative voltage level corresponding to the power level of the outgoing signal. The power level or voltage level is feedback to the DSP or controller, which, at a step 520 analyzes the voltage signal to compare the transmitted signal's power level with a target vale.

Based on the comparison of step 524, the operation, at a step 528, the method generates an amplifier control signal to maintain, increase, or decrease the power level of the outgoing signal. The detector, DSP or controller may generate the amplifier control signal. Power level may be controlled in any manner, but in one embodiment the power level is controlled by adjusting the gain. Accordingly, at a step 532, the driver amplifier adjusts the gain level to a desired level, responsive to the amplifier control signal. In this manner, the power level of the transmit signal may be maintained, increased or decreased to conform to operation under the communication standard. In a multi-band or multi-mode communication device, each different band or mode of operation may require a different power level and the actual transmit power level may change during use of the communication device. In addition, operation in different bands or modes may occur at different frequencies. At a step 536, the DSP or controller may update the target value, such as based on input received from a base station, or any other factor.

Figure 5B:
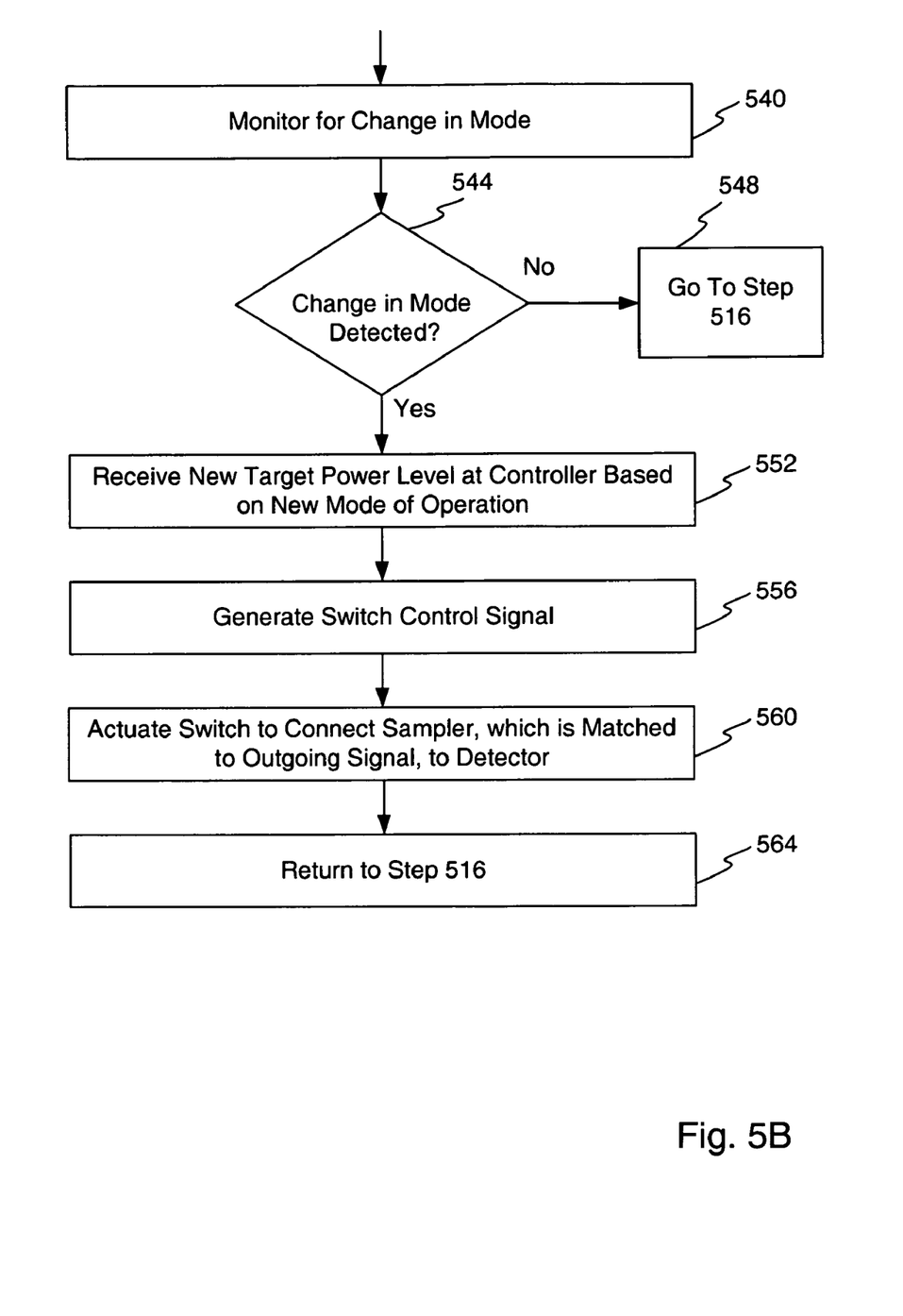

Turning now to FIG. 5B and a step 540, the system, such as a DSP, monitors for a change mode or band. It is contemplated that this may occur during an active communication session or in standby mode. Regardless, a seamless and uninterrupted transition between modes or bands of operation is desired. If at decision step 544 the monitoring does not detect a change in the mode, then the operation advances to step 548, and returns to step 516 as shown in FIG. 5A where the system samples the amplitude of the transmitted signal.

Alternatively, if at decision step 544 a change in mode is detected, then the operation advances to a step 552. At step 552, the operation receives or updates the target value at the DSP or controller based on the new mode of operation. As apart of the change to a new mode, at a step 556, the DSP or controller generates a switch control signal, which is provided to the switch, to integrate the proper sampler into the detector circuit. Accordingly, at a step 560 the switch is actuated to connect the output of the sampler, which is matched to the frequency band of the outgoing signal, to the detector. Next, at step 564, the operation returns to step 516 as described above.

The method and apparatus described herein provides the benefit of a low cost, switch based system for operation over multiple modes or bands. Use of a switch to selectively utilize an appropriate sampler overcomes drawbacks in the prior art to thereby provide an accurate method and system to monitor transmit power in a multi-mode communication device.

While various embodiments of the invention have been described, it will be apparent to those of ordinary skill in the art that many more embodiments and implementations are possible that are within the scope of this invention.

What is claimed is:

1. A method for controlling transmit power level in a multi-mode communication device comprising:
   sending a switch control signal to a switch responsive to a mode selected from two or more possible modes of operation;
   responsive to the switch control signal, connecting a sampler, corresponding to the selected mode, to a detector;
   amplifying an outgoing signal to generate an amplified outgoing signal;
   detecting the amplified outgoing signal to determine the power of the amplified outgoing signal;
   generating a power level feedback signal;
   processing the power level feedback signal to generate an amplifier control signal; and
   sending the amplifier control signal to an amplifier to control a power level of the outgoing signal.

2. The method of claim 1, wherein the power level feedback signal comprises a voltage level representing the power level of the amplified outgoing signal.

3. The method of claim 1, wherein processing the power feedback signal comprises comparing the power level feedback signal to a target value.

4. The method of claim 1, wherein connecting a sampler comprises configuring a switch to connect a sampler selected from two or more samplers to a detector.

5. The method of claim 1, further comprising monitoring the mode of operation, and upon detecting a change in mode of operation, generating a switch control signal.

6. The method of claim 1, wherein each mode of operation is associated with a frequency band.

7. A method for adjusting power level when switching between bands in a multiband wireless communication device comprising:
   monitoring for a change in mode of operation from a first mode to a second mode;
   responsive to detecting a change in mode of operation, generating and sending a switch control signal to a switch;
   responsive to the switch control signal, selectively changing a detector configuration from operation in a first detector mode to operation in a second detector mode wherein selectively changing a detector configuration comprises switching a sampler configured for operation in the second mode to be connected to the detector;
   detecting one or more aspects of an outgoing signal; and
   responsive to detecting one or more aspects of an outgoing signal, generating an amplifier control signal to thereby control the power level of the outgoing signal.

8. The method of claim 7, wherein generating and sending the amplifier control signal further comprises providing the amplifier control signal to an amplifier to control amplifier gain.

9. The method of claim 7, wherein a change in mode comprises operation within a different frequency band.

10. The method of claim 7, wherein detecting one or more aspects of the outgoing signal comprises detecting a power level of an amplified outgoing signal.

11. The method of claim 10, wherein responsive to detecting one or more aspects of an outgoing signal comprises comparing the power level of the outgoing signal, or a signal representing the power of the outgoing signal to a target value.

12. A system for controlling transmit power level in a multi-mode wireless communication device comprising;
   an amplifier configured to receive an outgoing signal and generate an amplified outgoing signal responsive to an amplifier control signal;
   a detector, configured to sample the amplified outgoing signal and generate a feedback signal corresponding to the power level of the amplified outgoing signal, wherein the detector is further configured with a switchable selector to configure operation of the detector to match a mode of operation wherein the switchable selector to comprises a multiband switch having three inputs and a single output; and
   a controller configured to process the feedback signal to generate the amplifier control signal.

13. The system of claim 12, wherein the detector comprises a diode.

14. The system of claim 12, wherein the controller comprises a digital signal processor.

15. The system of claim 12, wherein the switchable selector comprises a switch configured to receive a switch control signal from the controller to selectively utilize a sampler matched to an active mode of operation of the multi-mode wireless communication device 16. The system of claim 12, wherein the multi-mode wireless communication device comprises a multiband cellular telephone.

17. The system of claim 12, wherein the controller is configured to compare the feedback signal to a target value and responsive to the comparison, generate the amplifier control signal.

18. The system of claim 12, wherein the detector comprises two or more samplers, a switch, and a detector.

19. A system for controlling transmit power level in a multi-mode wireless communication device;
   an amplifier configured to receive an outgoing signal and generate an amplified outgoing signal responsive to an amplifier control signal;
   a detector, configured to sample the amplified outgoing signal and generate a feedback signal corresponding to the power level of the amplified outgoing signal, wherein the detector is further configured with a switchable selector to configure operation of the detector to match a mode of operation; and
   a controller configured to process the feedback signal to generate the amplifier control signal, wherein the switchable selector comprises a switch configured to receive a switch control signal from the controller to selectively utilize a sampler matched to an active mode of operation of the multi-mode wireless communication device.

20. The system of claim 19, wherein the detector comprises a diode.

21. The system of claim 19, wherein the controller comprises a digital signal processor.

22. The system of claim 19, wherein the multi-mode wireless communication device comprises a multiband cellular telephone.

23. The system of claim 19, wherein the controller is configured to compare the feedback signal to a target value and responsive to the comparison, generate the amplifier control signal.

24. The system of claim 19, wherein the detector comprises two or more samplers, a switch, and a detector.

25. A system for controlling transmit power level in a multi-mode wireless communication device;
   an amplifier configured to receive an outgoing signal and generate an amplified outgoing signal responsive to an amplifier control signal;
   a detector, configured to sample the amplified outgoing signal and generate a feedback signal corresponding to the power level of the amplified outgoing signal, wherein the detector is further configured with a switchable selector to configure operation of the detector to match a mode of operation, wherein the detector comprises two or more samplers, a switch, and a detector; and
   a controller configured to process the feedback signal to generate the amplifier control signal.

26. The system of claim 25, wherein the detector comprises a diode.

27. The system of claim 25, wherein the controller comprises a digital signal processor.

28. The system of claim 25, wherein the multi-mode wireless communication device comprises a multiband cellular telephone.

29. The system of claim 25, wherein the controller is configured to compare the feedback signal to a target value and responsive to the comparison, generate the amplifier control signal.

* * * * *